United States Patent [19]

Kiyono

[11] Patent Number: 5,455,452
[45] Date of Patent: Oct. 3, 1995

[54] SEMICONDUCTOR PACKAGE HAVING AN LOC STRUCTURE

[75] Inventor: Satsuo Kiyono, Moriyama, Japan

[73] Assignee: International Business Machines Corporation, Armonk, N.Y.

[21] Appl. No.: 252,858

[22] Filed: Jun. 2, 1994

[30] Foreign Application Priority Data

Jun. 25, 1993 [JP] Japan ................................. 5-154748

[51] Int. Cl.$^6$ .................... H01L 23/482; H01L 23/495; H01L 23/498
[52] U.S. Cl. .................. 257/668; 257/674; 257/775; 257/776
[58] Field of Search .................. 257/666, 668, 257/674, 676, 773, 775, 776

[56] References Cited

U.S. PATENT DOCUMENTS 5,357,139 10/1994 Yaguchi et al. ........................ 257/668

FOREIGN PATENT DOCUMENTS

| | | | |
|---|---|---|---|
| 129840 | 6/1991 | Japan | H01L/21/60 |
| 204965 | 9/1991 | Japan | H01L/23/50 |
| 255655 | 11/1991 | Japan | H01L/23/50 |
| 114438 | 4/1992 | Japan | H01L/21/60 |
| 013654 | 1/1993 | Japan | H01L/23/50 |

OTHER PUBLICATIONS

IMB Technical Disclosure Bulletin, vol. 34, No. 1, Jun. 1991, "Thin Small Outline Packages", E. J. Dombroski et al., pp. 358–359.

*Primary Examiner*—William Mintel
*Assistant Examiner*—Peter Toby Brown
*Attorney, Agent, or Firm*—Lawrence R. Fraley

[57] ABSTRACT

A semiconductor integrated circuit device and method of making same wherein recessed bus bar regions are provided in an elongated bus bar to accommodate bonding wires which couple the device's chip pads and associated inner leads. Fillets are formed of insulative adhesive material (from the tape used to secure the leads and bus bar to the chip) up about the bus bar region sides to thereby engage the bonding wires to prevent contact between the wires and bus bar.

9 Claims, 2 Drawing Sheets

SEMICONDUCTOR PACKAGE HAVING AN LOC STRUCTURE

TECHNICAL FIELD

The present invention relates to a semiconductor integrated circuit and, more specifically, to an assembly structure for a resin-sealing type semiconductor package having an LOC (lead-on-chip) structure.

BACKGROUND OF THE INVENTION

With the increase of the size and the integration degree of semiconductor memory chips, demands are growing that plastic sealing molds for packaging chips be smaller and thinner. A semiconductor package having an LOC structure has been proposed in line with this. A lead called the "bus bar" is used in an LOC structure type semiconductor package to accommodate a number of wires in a limited space. The bus bar serves as an inner lead for supplying a voltage (e.g., a power supply voltage (Vcc) and a reference voltage (Vss)) to a semiconductor chip, and is disposed so as to traverse the chip. Since the bus bar can be connected to any point of the chip by short-distance wire bonding to supply a voltage, it can be effectively employed to reduce noise and increase processing speed.

However, since bonding wires for connecting inner leads are provided with bonding pads traversing the bus bar, these wires may fall or may be laterally pushed and deformed by a mechanical impact during the assembly process, the weight of such wires, or the pressure of an injected resin sealing agent. In this manner, the bonding wires may contact the bus bar, or may contact each other, thus causing a short-circuit.

If bonding wires are wired so as to form a large loop in order to avoid contact thereof with a bus bar, the wires become longer, thus increasing manufacturing costs. Furthermore, the looping of bonding wires makes it more difficult to reduce the size and thickness of semiconductor devices.

To solve the above problems, various techniques for preventing short-circuiting due to the contact of two bonding wires or of a bonding wire and a bus bar have been proposed in the past. FIGS. 4 and 5 show an example of those conventional techniques.

One such technique is disclosed in Published Unexamined Patent Application (PUPA) No. 4-114438. FIG. 4 is a perspective view of an LSI (large scale index) package which is partially cut away. FIG. 5 is a sectional view taken along the shorter axis of the package in FIG. 4. As shown in FIGS. 4 and 5, a semiconductor chip 2 is sealed in a package main body 1. A pair of insulating films 3 is bonded to the principal surface of the semiconductor chip 2 so as to extend along its longer sides. The insulating films 3 are thin films of, for instance, polyimide type resin, and are bonded to the principal surface of the semiconductor chip 2 by an epoxy or polyimide type adhesive. A plurality of bonding pads 5 are formed on the central portion of the principal surface of the semiconductor chip 2 between the pair of insulating films 3 so as to be arranged along the longer sides of the chip 2. A plurality of inner leads 4 are bonded to the insulating films 3 so as to be arranged along the longer sides of the semiconductor chip 2. Each of the inner leads 4 is electrically connected to the corresponding bonding pad 5 on the semiconductor chip 2 through a bonding wire 6.

Among the plurality of inner leads 4, the leads 4 located at both ends of each side are electrically connected to each other through a bus bar 7. The bus bar 7 has a bracket-like pattern which extends along the two shorter sides and the one longer side (on the center side) of the insulating film 3, and is bonded to the insulating film 3 by, for instance, an epoxy or polyimide type adhesive. The bus bar 7 is made of a thin (several tens of micrometers) conductive foil of Cu (copper), etc., plated with a metal of Au (gold), etc. Since the bus bar 7 is quite a bit thinner than the inner lead 4, which has a thickness of 150–250 µm, a sufficiently long distance is located between the bus bar 7 and the bonding wires 6 traversing it, as especially shown in FIG. 5.

PUPA Nos. 3-129840 and 5-13654 disclose a technique in which an insulating substance is applied or stuck on a bus bar or a part of a land on which a semiconductor is mounted, and bonding wires are glued and fixed to the insulating substance.

Technical Disclosure Bulletin, Vol. 34, No. 1, which was published in June 1991 by IBM (International Business Machines) Corporation, discloses a technique in which bonding wires are connected so as to traverse a bus bar, and a circular insulating film, whose one or two surfaces are sticky, are arranged on the bus bar under the bonding wires. When an insulating double-sided adhesive film is used, the bonding wires are stuck and fixed to the bus bar by means of the insulating film.

PUPA No. 3-204965 discloses a technique in which an insulating film made of an epoxy resin is adhered on the top surface of the inner leads (or bus bar) by thermocompression bonding so that metal wires do not come into direct contact with the bus bar even if wire bonding is performed so that the metal wires traverse the bus bar.

PUPA No. 3-255655 discloses a technique in which a lead portion (wire connection portion) located under a bonding wire that traverses it and connected to another lead is coated with a thermosetting resin so that short-circuiting does not happen even when a bonding wire deformed by, for instance, a mechanical impact during the assembly process is brought into contact with the above lead portion.

However, according to the conventional techniques, a bus bar needs to be much thinner uniformly than the inner leads, an insulating adhesive needs to be applied to the top surface of a bus bar, wires coated with an insulating substance need to be used, and/or the attachment of an insulating film is needed.

It is believed that a circuit device as defined herein, which would overcome the aforementioned disadvantages, would represent a significant advancement in the art.

DISCLOSURE OF THE INVENTION

The present invention has been made in view of the above-described problems in the art, and has an object of providing an assembly structure which can reduce the size and thickness of a semiconductor memory package having an LOC structure.

Another object of the invention is to provide a highly reliable assembly structure which is free from short-circuiting between a bonding wire and a bus bar due to, for instance, the falling of the bonding wire.

In accordance with one aspect of the invention, there is provided a semiconductor integrated circuit device comprising inner leads arranged on a semiconductor chip, bonding pads arranged on a peripheral portion of the semiconductor chip, a bus bar placed on the semiconductor chip between the inner leads and the bonding pads, bonding wires connecting tip portions of the inner leads and the bonding pads so as to traverse the bus bar, and an insulating double-sided adhesive tape bonding the inner leads and the bus bar to the semiconductor chip. The bus bar has been etched to form steps and bus bar regions which are to be traversed by the bonding wires, and fillets have been formed on side surfaces of the inner leads and the bus bar by heating one surface of the insulating tape that is attached to the back surfaces of the inner leads and the bus bar while pressing the insulating tape.

In accordance with another aspect of the invention, there is provided a method for forming an insulating portion on a bus bar used in semiconductor packages, the method comprising the steps of forming a long and narrow bus bar on a semiconductor chip between bonding pads and inner leads, etching, in advance, the bus bar to produce steps and bus bar regions which are to be traversed by bonding wires, attaching one surface of an insulating tape on the back surfaces of the inner leads and the bus bar, heating the insulating tape while pressing it, attaching the semiconductor chip on the other surface of the insulating tape, and heating the insulating tape while pressing it and heat-setting the insulating tape.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
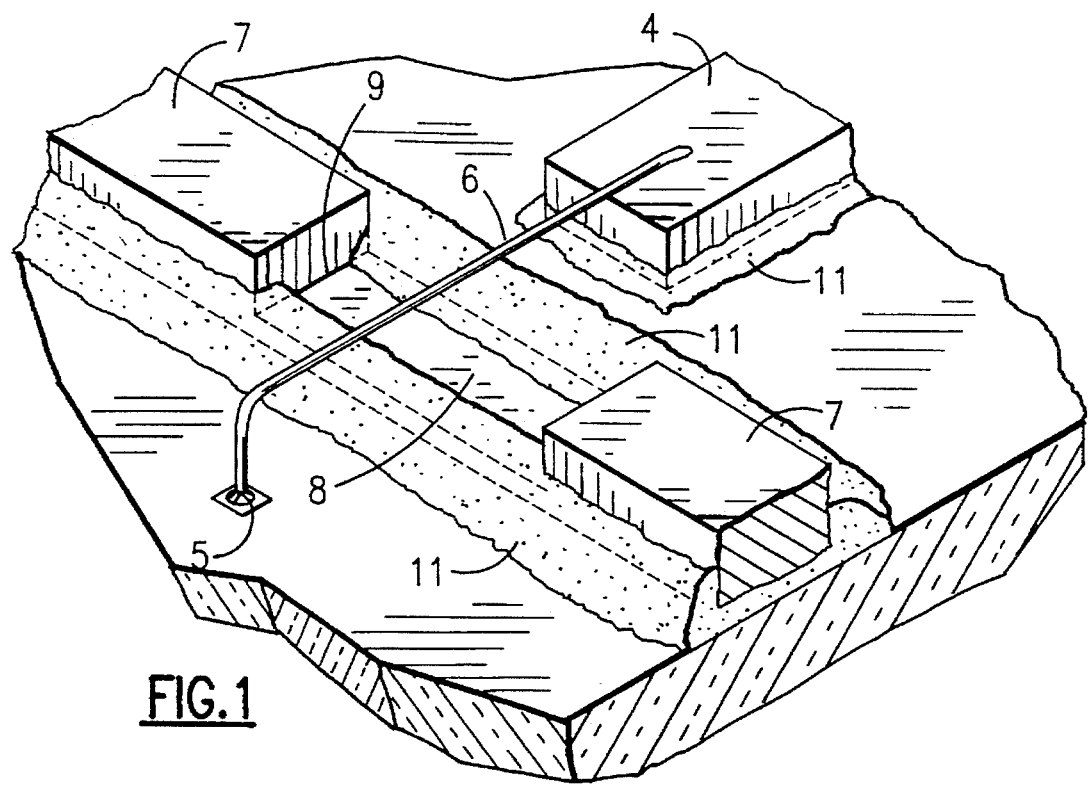
FIG. 1 is a much enlarged, partial perspective view of a part of a semiconductor integrated circuit device showing an embodiment of the present invention.
Figure 2:
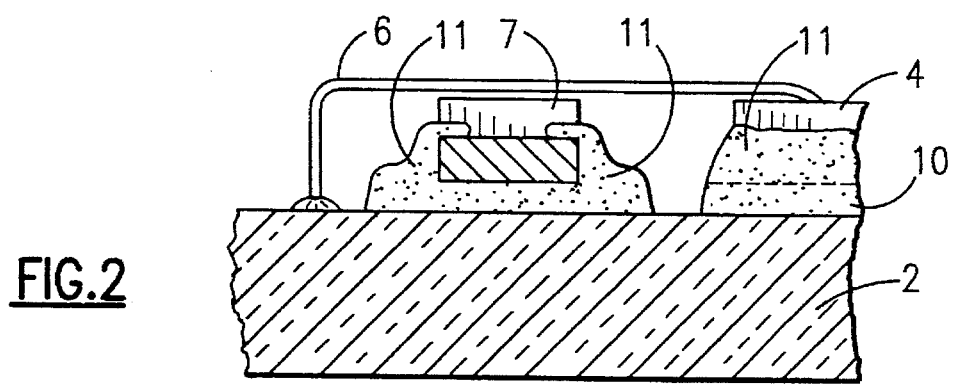
FIG. 2 is a partial sectional view, in elevation, of the device of FIG. 1.
Figure 3:
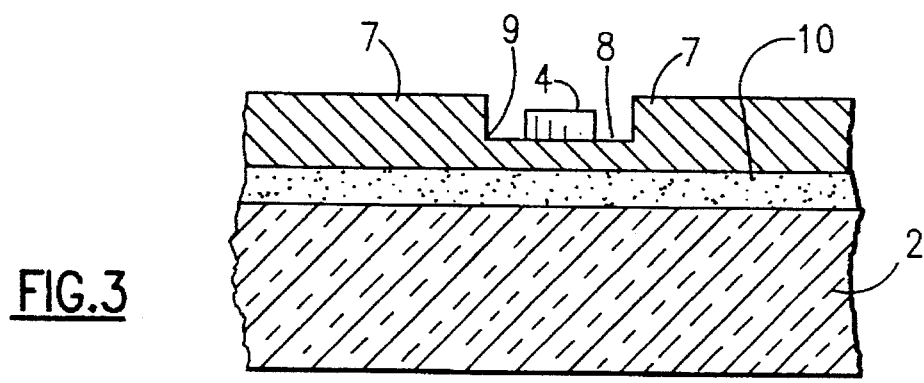
FIG. 3 is a partial sectional view, in elevation, of the device of FIG. 1.
Figure 4:
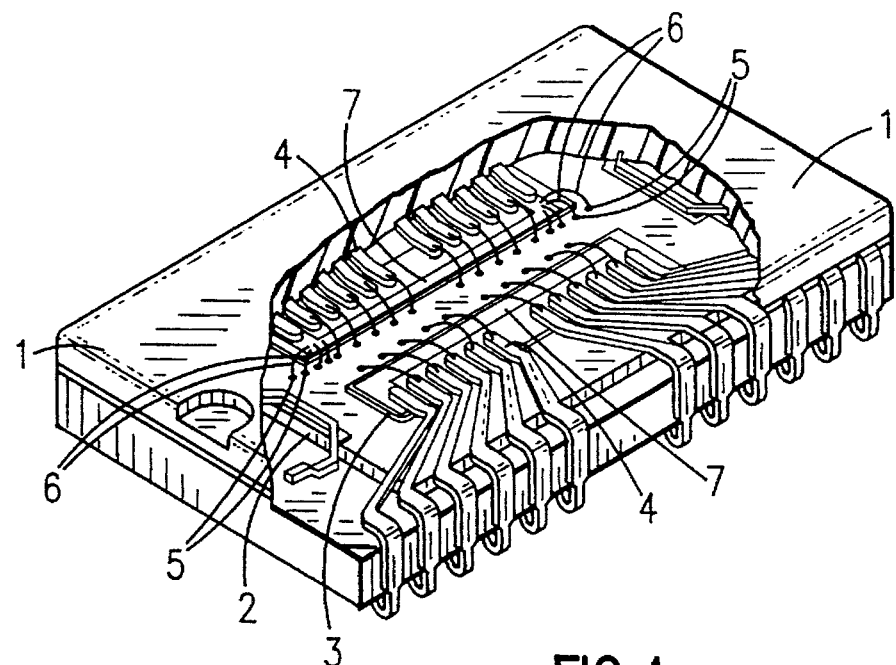
FIG. 4 is a perspective view of a conventional semiconductor integrated circuit device which is partially cut away, and of a smaller scale than FIGS. 1–3.
Figure 5:
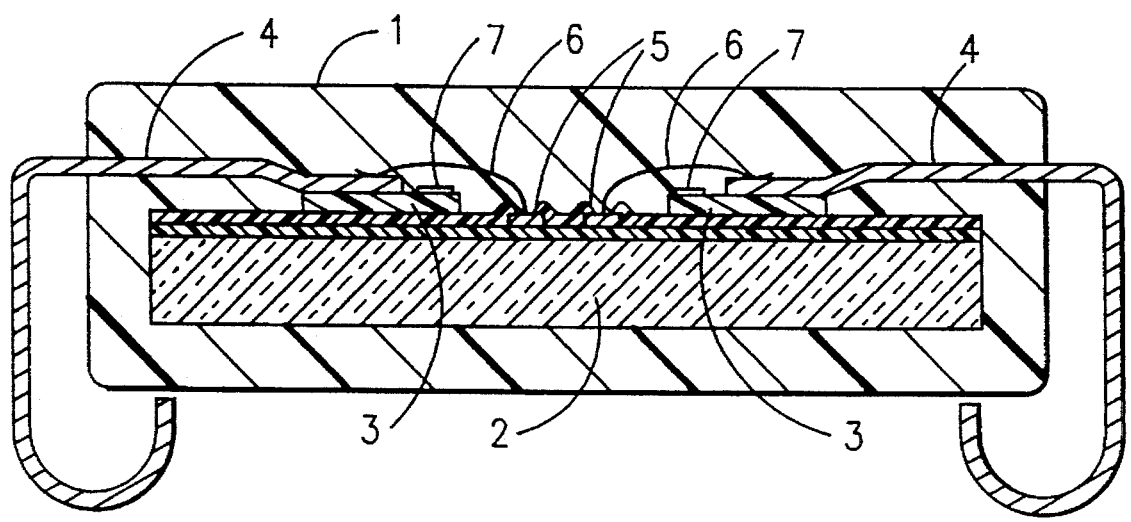
FIG. 5 is a sectional view, in elevation and on an enlarged scale over FIG. 4 of the conventional device of FIG. 4.

As shown in FIGS. 1–3, a bus bar 7 in accordance with one embodiment of the invention is etched in advance to produce steps 9 and a plurality of bus bar regions 8 which are to be traversed by respective bonding wires 6, with considerations of the diameter, weight and length of the bonding wires used, how these wires might tend to fall, and other factors. Although only one bus bar region 8 is shown in FIG. 1, it is understood that several may be formed in accordance with the teachings of the invention.

One surface of the bonding layer(s) of an insulating tape 10 (FIG. 2) is attached to the back surfaces of the inner leads 4 and the bus bar 7 having the steps 9, the insulating tape heated while being pressed at a predetermined pressure. As a result, portions of the bonding layer of the insulating tape 10 "climb up" the side surfaces of the inner leads 4 and the bus bar 7 to form fillets 11. The fillets 11 cover the side surfaces and part of the top surface of each etched bus bar region 8, as seen in FIGS. 1 and 2.

As understood from the above, the steps 9 are formed by etching only adjacent to the bus bar regions 8 which are to be traversed by the bonding wires 6, such that a sufficiently large interval (space) can be located between the bonding wires 6 and the bus bar 7 when such a large interval is required. Additionally, since the fillets 11 are formed so as to cover the bus bar region 8 having steps 9, these fillets can receive the bonding wire 6 without the wire coming into contact with the bus bar region 8, even if the bonding wire 6 falls for some reason (e.g., mechanical engagement).

In the semiconductor package according to one embodiment of the invention, a long and narrow bus bar 7 of 50 μm in thickness is formed between bonding pads 5 (FIG. 1, not shown in FIG. 2) on a semiconductor chip 2 and an inner lead 4, in basically the same manner as in the conventional packages. However, the bus bar 7 has been etched in advance to produce steps 9 and a plurality of bus bar regions 8 which are to be traversed by respective bonding wires 6 so that the thickness of the bus bar regions 8 becomes approximately half that of the other regions of the bus bar 7 over a length of 330 μm, in consideration of the diameter and length of the bonding wires 6 used, the conditions under which these might fall, and other factors. Since this structure provides a sufficient interval between the bonding wire 6 and the top surface of the half-etched bus bar region 8, the bonding wire 6 for connection need not have a large loop and, therefore, its length can be reduced.

A thermosetting insulating tape 10 which is formed by applying a half-set, epoxy, or phenol type adhesive of 20 μm in thickness is formed next on both surfaces of a 50-μm-thick base layer of a polyimide resin. As shown in FIG. 3, one surface of the insulating tape 10 thus prepared is attached to the back surface of the inner lead 4 and the bus bar 7 having the steps 9. The insulating tape thus attached is heated for 1.7 seconds at 160° C. while being pressed at 50 kgf/mm$^2$. During this heating and pressing operation, the adhesive layer of the insulating tape 10 "climbs up" the side surfaces of the inner lead 4 and the bus bar 7 up to a height of about 100 μm, to form fillets 11. As shown in FIG. 2, the fillets 11 are of a structure that covers the side surfaces and part of the top surface of each etched bus bar region 8. By virtue of this structure, even when, for instance, the bonding wire 6 falls, it hits the fillet 11 without coming into contact with the bus bar 7 or the bus bar region 8, thus avoiding short-circuits. Furthermore, it is possible to form insulating layers that stand erect on both sides of the etched bus bar region 8 by properly changing the conditions (heat, pressure) of attaching the insulating tape 10.

Next, the other surface of the insulating tape 10 is attached to the semiconductor chip 2, and the insulating tape 10 is heated for 10 seconds at 140° C. while being pressed at 20 kgf/mm$^2$. Finally, the insulating tape 10 is set by being heated for one hour at 165° C.

Although in the above embodiment the insulating tape 10 is a thermosetting tape, it may be a thermoplastic insulating tape or a single-layer, polyimide or epoxy insulating tape. In the case of a thermoplastic insulating tape, it is pressed at, for instance, 300° C., which is higher than in the case of using the thermosetting insulating tape.

According to the invention, the process for preventing contact between bonding wires and a bus bar can be made simpler than in the conventional process. Furthermore, since the loops of the bonding wires can be shortened, it becomes possible to reduce the size and thickness of semiconductor packages.

While there have been shown and described what are at present considered the preferred embodiments of the invention, it will be obvious to those skilled in the art that various changes and modifications may be made therein without departing from the scope of the invention as defined by the appended claims.

What is claimed is:

1. A semiconductor integrated circuit device comprising:

a semiconductor chip;

inner leads arranged on said semiconductor chip and including tip portions;

bonding pads arranged on said semiconductor chip;

a bus bar placed on said semiconductor chip between said inner leads and said bonding pads;

bonding wires connecting tip portions of said inner leads and said bonding pads so as to traverse said bus bar; and an electrically insulative adhesive tape bonding said inner leads and said bus bar to said semiconductor chip, said bus bar including recessed, stepped portions defining bus bar regions which are to be traversed by said bonding wires, said adhesive tape including fillets formed on side surfaces of said inner leads and said bus bar relative to said bus bar regions for engaging said bonding wires to prevent short circuiting between said wires and said bus bar regions should said bonding wires come in close proximity to said bus bar.

2. The semiconductor integrated circuit device according to claim 1, wherein the height of the steps of said recessed bus bar regions is half the total thickness of said bus bar.

3. The semiconductor integrated circuit device according to claim 1, wherein said fillets are formed so as to cover said side surfaces and a top surface of each of said bus bar regions.

4. The semiconductor integrated circuit device according to claim 1, wherein said fillets are formed so as to stand erect on both sides of the bus bar.

5. The semiconductor integrated circuit device according to claim 1, wherein said insulative tape is a thermosetting insulative tape.

6. The semiconductor integrated circuit device according to claim 1, wherein said insulative tape is a thermoplastic insulative tape.

7. The semiconductor integrated circuit device according to claim 1, wherein said insulative tape is a single-layer insulative tape of a material selected from the group consisting of polyimide and epoxy resin.

8. The semiconductor integrated circuit device according to claim 5, wherein said thermosetting insulative tape includes a base layer with two surfaces, each of said surfaces including an adhesive thereon.

9. The semiconductor integrated circuit device of claim 8 wherein said base layer is comprised of polyimide and said adhesive is selected from the group consisting of epoxy and phenol-type adhesives.

* * * * *